(12) United States Patent
Hu et al.

(10) Patent No.: US 9,564,580 B2
(45) Date of Patent: Feb. 7, 2017

(54) DOUBLE SYNTHETIC ANTIFERROMAGNET USING RARE EARTH METALS AND TRANSITION METALS

(71) Applicant: International Business Machines Corporation, Armonk, NY (US)

(72) Inventors: Guohan Hu, Yorktown Heights, NY (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 22 days.

(21) Appl. No.: 14/584,001

(22) Filed: Dec. 29, 2014

(65) Prior Publication Data
US 2016/0190434 A1   Jun. 30, 2016

(51) Int. Cl.
| | |
|---|---|
| H01L 43/08 | (2006.01) |
| H01L 43/02 | (2006.01) |
| H01L 43/12 | (2006.01) |
| G11C 11/16 | (2006.01) |
| H01L 43/10 | (2006.01) |

(52) U.S. Cl.
CPC ............. *H01L 43/08* (2013.01); *G11C 11/161* (2013.01); *H01L 43/02* (2013.01); *H01L 43/10* (2013.01); *H01L 43/12* (2013.01)

(58) Field of Classification Search
CPC ........ H01L 27/222; H01L 43/02; H01L 43/08; H01L 43/10; H01L 43/12; G11C 11/161; H01F 10/3218; H01F 10/3268; H01F 10/3272; H01F 10/3277; H01F 10/324

USPC ............. 438/3, 151; 257/421, 347, E21.002, 257/E29.323; 365/158; 714/769
See application file for complete search history.

(56) References Cited

U.S. PATENT DOCUMENTS

| | | | |
|---|---|---|---|
| 6,430,013 B1 * | 8/2002 | Pinarbasi | B82Y 10/00 360/324.12 |
| 7,230,265 B2 | 6/2007 | Kaiser et al. | |
| 7,572,645 B2 | 8/2009 | Sun et al. | |
| 8,045,366 B2 | 10/2011 | Zheng et al. | |
| 2008/0112214 A1 | 5/2008 | Chung et al. | |
| 2012/0023386 A1 * | 1/2012 | Oh | H01L 43/08 714/769 |
| 2012/0205759 A1 | 8/2012 | Hu | |
| 2012/0261777 A1 | 10/2012 | Shukh | |
| 2012/0267733 A1 | 10/2012 | Hu et al. | |
| 2012/0292724 A1 | 11/2012 | Lim et al. | |
| 2013/0154034 A1 * | 6/2013 | Apalkov | H01L 43/08 257/421 |

(Continued)

OTHER PUBLICATIONS

Durlam, M., et al., "A 1-Mbit MRAM Based on 1T1MTJ Bit Cell Integrated with Copper Interconnects," IEEE Journal of Solid-State Circuits, vol. 38, No. 5, 2003, pp. 769-773.

(Continued)

*Primary Examiner* — Kenneth Parker
*Assistant Examiner* — Bo Fan
(74) *Attorney, Agent, or Firm* — Cantor Colburn LLP; Vazken Alexanian

(57) ABSTRACT

A mechanism relates to magnetic random access memory (MRAM). A free magnetic layer is provided and first fixed layers are disposed above the free magnetic layer. Second fixed layers are disposed below the free magnetic layer. The first fixed layers and the second fixed layers both comprise a rare earth element.

18 Claims, 6 Drawing Sheets

Radial coordinate, r, in middle of free layer (nm)

(56) References Cited

U.S. PATENT DOCUMENTS

2013/0270661 A1* 10/2013 Yi .......................... H01L 43/08
                                                       257/421
2014/0353662 A1* 12/2014 Shukh ................. H01L 27/2436
                                                       257/43

OTHER PUBLICATIONS

Lee, C., et al., "Magnetic Properties of TbFeCo-Based Perpendicular Magnetic Tunnel Junctions," Journal of Applied Physics, vol. 107, No. 9, 2010, 09C712; 3 pages.
Worledge, D., et al., "Switching Distributions and Write Reliability of Perpendicular Spin Torque MRAM," 2010 IEEE International Electron Devices Meeting (IEDM), pp. 12.5.1-12.5.4.
Hu, Guohan, et al.; "Double Synthetic Antiferromagnet Using Rare Earth Metals and Transition Metals"; U.S. Appl. No. 15/054,721, filed Feb. 26, 2016.
List of IBM Patents or Patent Applications Treated as Related—Date Filed: Jun. 17, 2016; 1 page.

* cited by examiner

DOUBLE SYNTHETIC ANTIFERROMAGNET USING RARE EARTH METALS AND TRANSITION METALS

BACKGROUND

The present invention relates to magnetic random access memory (MRAM), and more specifically, to using rare earth and transition metals in reference and dipole layers.

A spin torque magnetic random access memory (MRAM) device uses a two terminal spin-torque based memory element. The two terminal spin-torque based memory element includes a pinned layer, a tunnel barrier layer, and a free layer in a magnetic tunnel junction (MTJ) stack. The pinned layer is also called the reference layer. The magnetization of the pinned layer is fixed in a direction such that when current passes through the MTJ stack the free layer becomes either parallel or anti-parallel to the pinned layer. Resistance of the device depends on the relative orientation of the free layer and the pinned layers.

SUMMARY

According to one embodiment, a magnetic random access memory (MRAM) device is provided. A free magnetic layer is provided, and first fixed layers are disposed above the free magnetic layer. Second fixed layers are disposed below the free magnetic layer. The first fixed layers and the second fixed layers both comprise a rare earth element.

According to one embodiment, a method of forming a magnetic random access memory (MRAM) device is provided. The method includes providing a free magnetic layer, disposing first fixed layers above the free magnetic layer, and disposing second fixed layers below the free magnetic layer. The first fixed layers and the second fixed layers both comprise a rare earth element.

According to one embodiment, a magnetic random access memory (MRAM) device is provided. The MRAM device includes a free magnetic layer, a first synthetic antiferromagnet (SAF) above the free magnetic layer, a tunnel barrier sandwiched between the free magnetic layer and the first synthetic antiferromagnet, a second synthetic antiferromagnet below the free magnetic layer. The first synthetic antiferromagnet and the second antiferromagnet both comprise a rare earth element. An oxide layer is sandwiched between the free magnetic layer and the second synthetic antiferromagnet.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Spin torque MRAM requires that the magnetic tunnel junction (MTJ) stack has a well-centered hysteresis loop with zero offset field. The dipole field emanating from the reference layers acts on the free layer and offsets the free layer hysteresis loop so that it is not centered on zero field. When the free layer hysteresis loop is not well centered the activation energy, required for data retention, is reduced. State-of-the-art techniques require using a synthetic antiferromagnet containing a 0.4 nanometer (nm) ruthenium (Ru) spacer, which is difficult to manufacture. If a dipole layer uses a rare-earth metal in the state of the art, there is no way to set the (magnetic moment) dipole layers in the correct direction reliably.

According to an embodiment, a spin torque MRAM device can use two (or more) rare-earth and transition metal multilayers. The two rare earth and transition metal multilayers include one layer as a reference layer (in which the reference layer contains a thin nonmagnetic spacer such as a tantalum (Ta) nonmagnetic spacer) and one layer as a dipole layer. Although tantalum may be utilized as one option, the nonmagnetic spacer layer does not need to be made from tantalum. The nonmagnetic spacer may also be made from niobium (Nb), tungsten (W), molybdenum (Mo), zirconium (Zr), and/or any other non-magnetic material. The thin Ta nonmagnetic spacer is not required to be continuous (i.e., the material may have holes in it) and thus is easily manufacturable. Although in one implementation, the Ta nonmagnetic spacer may be continuous if desired. The nonmagnetic spacer enables the coercivity, Hc, of the reference layer to be tuned to a low value. However, the dipole layer has a very large coercivity Hc. In this way, there is a large window between the Hc of the reference layer and Hc of the dipole layer, so that every bit can be set correctly.

In materials science, the coercivity (Hc), also called the coercive field or coercive force, is a measure of a ferromagnetic material to withstand an external magnetic field. The coercivity is the amount of magnetic field required to switch the magnetic moment of the reference layer and dipole layer, respectively.

Figure 1:
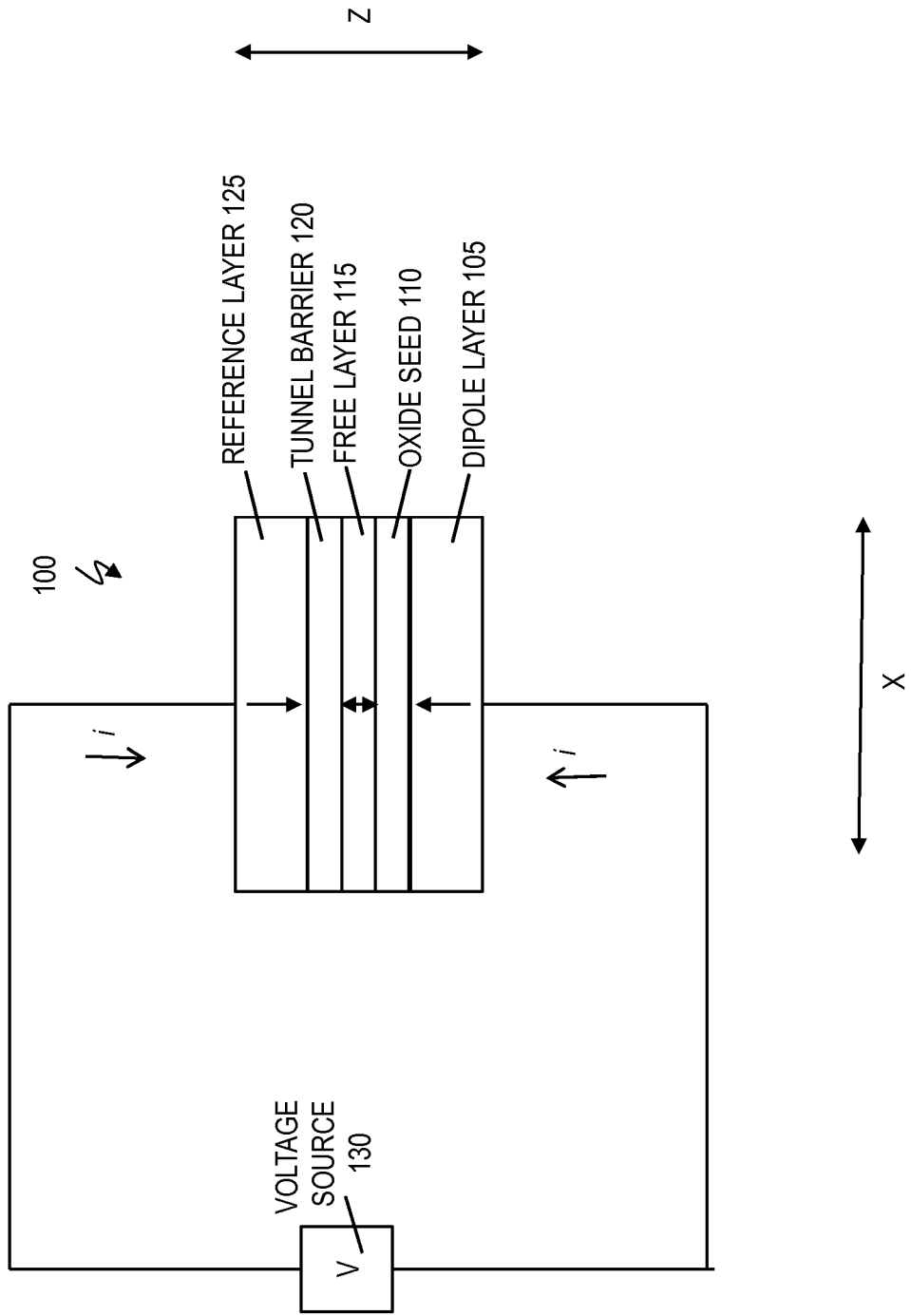
FIG. 1 illustrates a magnetic random access memory (MRAM) device.

Now turning to the figures, FIG. 1 illustrates a magnetic random access memory (MRAM) device 100. As shown in FIG. 1, MRAM device 100 includes a reference layer 125 (also referred to as a pinned magnetic layer), a tunnel barrier layer 120, and a free magnetic layer 115 adjacent to the tunnel barrier layer 120. The reference layer 125, tunnel barrier layer 120, and free magnetic layer 115 form a magnetic tunnel junction (MTJ) stack.

The MRAM device 100 also includes an oxide seed 110 adjacent to the free magnetic layer 115 and a dipole magnetic layer 105 adjacent to the free magnetic layer 115. The oxide seed 110 helps to make the free magnetic layer 115 have perpendicular magnetization.

The reference magnetic layer 125 may be formed of iron platinum (FePt) or iron palladium (FePd). The reference magnetic layer 125 may be formed of at least one of platinum (Pt) or palladium (Pd), and at least one of cobalt iron CoFe or cobalt (Co). The tunnel barrier layer 120 may be formed of magnesium oxide (MgO). The oxide seed 110 may be formed of MgO. The dipole magnetic layer 105 may be almost identical to the reference magnetic layer 125, in order to cancel out the stray field (exhibited upon the free magnetic layer 115).

The magnetic moment of the reference magnetic layer 125 is shown by a downward pointing arrow. The magnetic moment of the dipole magnetic layer 105 is shown by an upward pointing arrow, which means the stray fields caused by the magnetic moments of the dipole layer 105 and reference layer 125 are intended to cancel out one another. The magnetic moment of the free magnetic layer 115 is shown by a double arrow indicating that the magnetic moment can be switched either up or down according to the direction of an applied current from the voltage source 130. The magnetic moments of the reference, free, and dipole layers are all perpendicular to the plane of MRAM device 100.

The free magnetic layer 115 has a magnetic moment that is either parallel or anti-parallel to the magnetic moment of the pinned reference magnetic layer 125. The tunnel barrier layer 120 is thin enough that a current through it can be established by quantum mechanical tunneling of conduction electrons. The resistance of the free magnetic layer 115 changes in response to the relative orientation between the free magnetic layer 115 and the reference magnetic layer 125. For example, when a current (i) passes down through the MTJ stack in a direction perpendicular to the MTJ stack layers, the magnetic moment of the free magnetic layer 115 is rotated parallel to the reference layer 125 (i.e., "1" memory state), resulting in a lower resistance. When a current (i) is passed up through the MTJ stack, the magnetic moment of the free magnetic layer 115 is rotated antiparallel to the reference layer 125 (i.e., "0" memory state), resulting in a higher resistance.

In the state of the art, there are not materials utilized that give large enough Hc (e.g., Hc>2000 oersted (Oe)), and that provide a large enough window between the Hc of the reference magnetic layer 125 and the Hc of the dipole layer 105.

Figure 2:
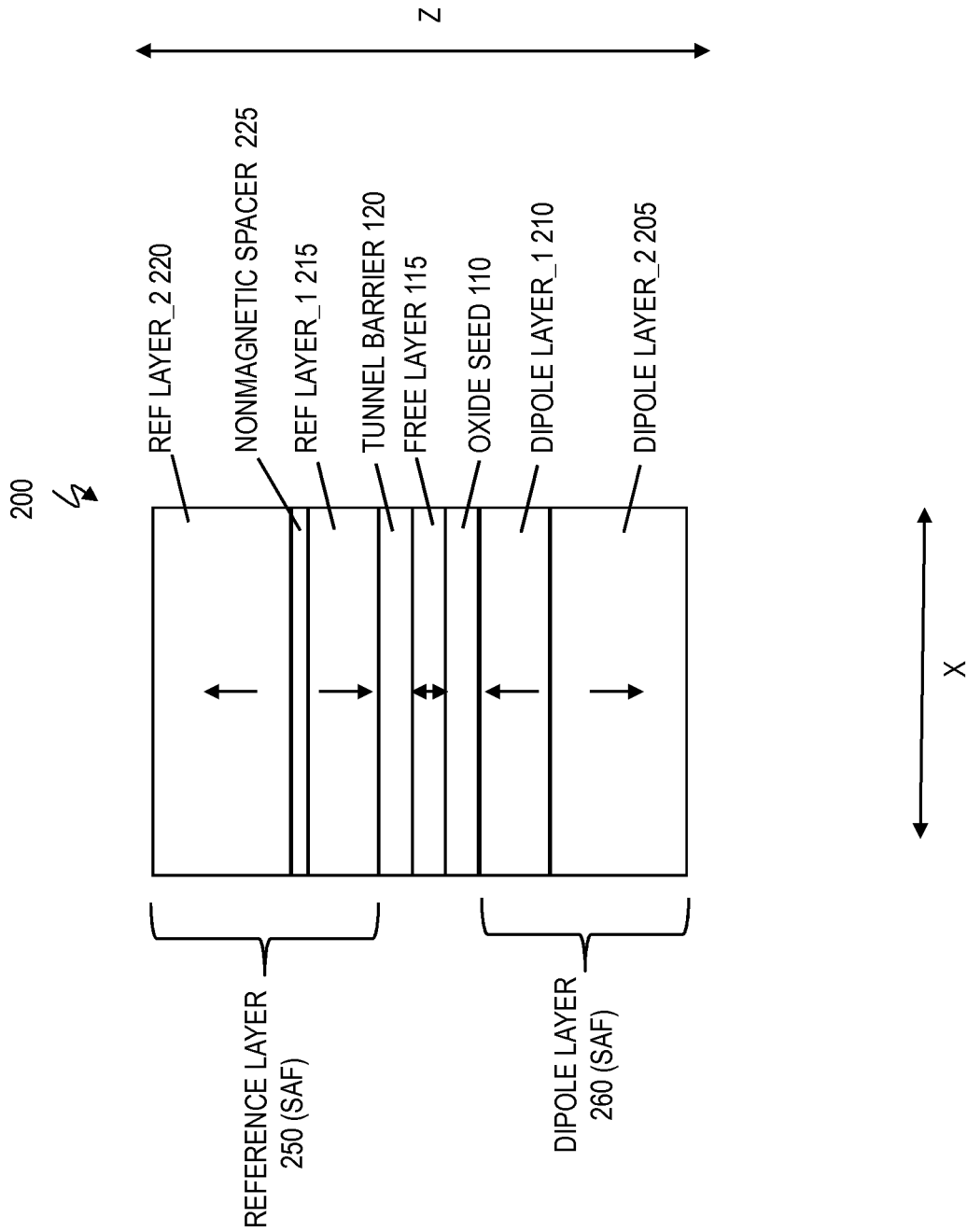
FIG. 2 illustrates a magnetic random access memory (MRAM) device according to an embodiment.

It might be desirable to have one Hc small such as approximately (~) 3 kiloOe (kOe) and to have the other Hc large such as approximately (~) 15 kOe according to an embodiment (shown in FIG. 2). This would provide a large window or large difference (15–3 kOe=12 kOe) between the required switching field coercivity (Hc) of the reference magnetic layer (250) as opposed to the dipole magnetic layer (260) according to an embodiment.

Assume that the Hc of the reference layer is higher than the Hc of the dipole layer. To set the magnetic moments of both the reference layer 125 and the dipole layer 105, a large magnetic field at least equal to the larger Hc of the reference layer is applied downward on the MRAM device 100 to set the magnetic moments of both the reference layer 125 and the dipole layer 105 down. If the Hc of the reference layer 125 is 1 kOe and the Hc of the dipole layer 105 is 0.5 kOe, then the large magnetic field to set the magnetic moments is at least 1 kOe. As such, this large magnetic field (of, e.g., 1 kOe) switches both magnetic moments down.

To set the magnetic moment of the dipole layer 105 upward, a smaller magnetic field pointing up is applied. This smaller magnetic field is to be at least 0.5 kOe (but less than 1 kOe) to switch the magnetic moment of the dipole layer 105 (with Hc of 0.5 kOe) but not the reference layer 125 (requiring Hc of 1 kOe). However, in the state of the art, the Hc of the reference and dipole layers may not always be exactly the same for all junctions, and so there is not a large window between/separating the respective Hc of reference and dipole layers. When using the smaller magnetic field of 0.5 kOe to set the dipole magnetic layer 105 (having Hc=0.5 kOe), the magnetic moment of the reference layer 125 may inadvertently be set on some of the junctions in the memory array because of the small window between the Hc of the reference layer 125 and the dipole layer 105. As understood by one skilled in the art, there are multiple MRAM devices connected in an array.

According to an embodiment, FIG. 2 illustrates a magnetic random access memory (MRAM) device 200. The MRAM device 200 has the tunnel barrier layer 120, free magnetic layer 115, and oxide seed 110 as discussed in FIG. 1. Additionally, MRAM device 200 includes reference magnetic layer_2 220 adjacent to a nonmagnetic spacer layer 225, and a reference magnetic layer_1 adjacent to both the nonmagnetic spacer 225 and the tunnel barrier layer 120. On the other side of the free magnetic layer 115, a dipole magnetic layer_1 210 is adjacent to the oxide seed layer 110, and a dipole magnetic layer_2 205 is adjacent to the dipole layer_1 210.

The reference layer_1 215 and the reference layer_2 220 have opposite pointing magnetic moments and together form a synthetic antiferromagnet (SAF). The combination (and combined effect) of reference layer_1 215 and the reference layer_2 220, along with the nonmagnetic spacer 225 acts as a single reference magnetic layer 250. The reference magnetic layer 250 has its own Hc, which is the combined effects of the Hc for reference magnetic layer_1 215 and reference magnetic layer_2 220 (as reduced by the nonmagnetic spacer 225)

The dipole magnetic layer_1 205 and the dipole magnetic layer_2 210 have opposite magnetic moments and together form a synthetic antiferromagnet (SAF). The combination (and combined effect) of dipole magnetic layer_1 205 and the dipole magnetic layer_2 210 acts as a single dipole magnetic layer 260. The dipole magnetic layer 260 has its own Hc, which is the combined effects of the Hc for the dipole magnetic layer_1 210 and dipole magnetic layer_2 205.

In FIG. 2, the dipole magnetic layer_1 210, dipole magnetic layer_2 205, reference magnetic layer_1 215, reference magnetic layer_2 220 are all made out of rare-earth metal and transition metal multilayers and/or rare-earth metal and transition-metal alloys. For example, the rare-earth metal and transition-metal alloy may be CoFeTb. In another example, the rare-earth metal and transition-metal multilayers may include one or more alternating layers of a layer of CoFe, a layer of Tb, a layer of CoFe, a layer of Tb, and so forth.

A rare earth element (REE) (or rare earth metal) is one of fourteen rare earth elements composed of the lanthanide series. The rare earth metals are found in group 3 of the periodic table, and the 6th period. Rare earth elements in the lanthanide series include cerium, praseodymium, neodymium, promethium, samarium, europium, gadolinium, terbium, dysprosium, holmium, erbium, thulium, ytterbium, and lutetium. Terbium (Tb) and gadolimium (Gd) work better than other rare earth elements, since Tb and Gd provide more perpendicular magnetic anisotropy.

The transition metals which are ferromagnetic at room temperature include iron, cobalt, and nickel.

Use of the nonmagnetic spacer 225 (e.g., 2 angstroms (Å) of Ta) in the reference magnetic layer 250 (which is utilized to increase magneto resistance (MR)) creates a low direct write field (Hd) for the reference magnetic layer 250, such as Hc is approximately (~) 3 kOe. Note that in a special case the direct write field Hd of reference magnetic layer 250 is equal to Hc, such that Hd=Hc=3 kOe for the reference magnetic layer 250. The dipole magnetic layer 260 does not include the Ta nonmagnetic spacer, so the dipole magnetic layer 260 has a very large Hc (in comparison to the reference magnetic layer 250), such as Hc~15 kOe. This difference in Hc (between the dipole and reference layers) allows enough margin to set the directions for the magnetic moments for both the dipole magnetic layer 260 and reference magnetic layer 250. To set the MRAM device 200, first apply a positive field of more than 15 kOe to set the magnetization of both dipole layer 1 and reference layer 1 pointing up. Then apply a field between 3 and 15 kOe, for example 9 kOe, to reverse only the reference layer 1 (make it point down), while leaving the dipole layer 1 pointing up.

According to an embodiment, the Hc (e.g., 3 kOe) of the reference magnetic layer 250 maintains the same relationship as a function of temperature to the Hc (e.g., 15 kOe) of dipole magnetic layer 260 because the same materials are utilized in both the reference magnetic layer_1 215 and the dipole magnetic layer_1 210 and the same materials are utilized in both reference magnetic layer_2 220 and dipole magnetic layer_2 205. Also, the Hc of the reference magnetic layer 250 and the Hc of dipole magnetic layer 260 have a large window of separation between the two, and the Hc of the reference magnetic layer 250 and the Hc of dipole magnetic layer 260 both change in the same manner with temperature.

The reference magnetic layer_1 215, the reference magnetic layer_2 220, the dipole magnetic layer_1 210, and the dipole magnetic layer_2 205 each has its own magnetic moment pointing in a respective direction. Each individual magnetic moment (in the reference magnetic layer_1 215, the reference magnetic layer_2 220, the dipole magnetic layer_1 210, and the dipole magnetic layer_2 205) creates/generates a dipole field. Dipole fields, sometimes referred to as stray fields, can act upon the free magnetic layer 115. The dipole fields (corresponding to respective magnetic moments) created by the reference magnetic layer_1 215, the reference magnetic layer_2 220, the dipole magnetic layer_1 210, and the dipole magnetic layer_2 205 are configured to cancel each other out at the position of the free layer; this cancellation of the dipole fields (that affect the free magnetic layer 115) is because of the construction of equal and opposite dipole fields in reference magnetic layer 250 and dipole magnetic layer 260.

Cancellation of dipole fields happens between reference magnetic layer_2 220 and the dipole magnetic layer_2 205. Particularly, the dipole field of the reference magnetic layer_2 220 is cancelled out by the dipole field of the dipole magnetic layer_2 205. The reference magnetic layer_2 220 and the dipole magnetic layer_2 205 are made of the same material (such as, e.g., Co, Fe, and Tb in one case, or Co, Fe, and Gd in another case) and have the same thickness (in the z axis) but have magnetic moments in the opposite directions. Having magnetic moments in opposite directions allows for dipole fields in the opposite direction, thus cancelling the dipole field (or stray field) effect on the free magnetic layer 115 from reference magnetic layer_2 220 and the dipole magnetic layer_2 205.

Similarly, cancellation of dipole fields happens between reference magnetic layer_1 215 and the dipole magnetic layer_1 210. Particularly, the dipole field of the reference magnetic layer_1 215 is cancelled out by the dipole field of the dipole magnetic layer_1 210. The reference magnetic layer_1 215 and the dipole magnetic layer_1 210 are made of the same material (such as, e.g., Co, Fe, and Tb in one case, or Co, Fe, and Gd in another case) and have the same thickness (in the z axis), but have magnetic moments in the opposite directions. Having magnetic moments in opposite directions allows for dipole fields in the opposite direction, thus cancelling the dipole field (or stray field) effect on the free magnetic layer 115 from reference magnetic layer_1 215 and the dipole magnetic layer_1 210.

In a typical MRAM device, the operational temperature may change from between 0-85° Celsius (C.), which causes a change in the magnitude of the magnetic dipole field, along with a change in Hc. However, since the material and thickness are identical in both the reference magnetic layer_1 215 and the dipole magnetic layer_1 210, the magnitudes of their respective dipole fields change in the same amount (i.e., change in the same values). For example, when the magnitude of the dipole field for reference magnetic layer_1 215 increases because of a change in temperature, the magnitude of the dipole field for the dipole magnetic layer_1 210 increases in the same amount. This also occurs when the magnitudes decrease because of a change in temperature.

Similarly, since the material and thickness are identical in both the reference magnetic layer_2 220 and the dipole magnetic layer_2 205, the magnitudes of their respective magnetic dipole fields change in the same amount (i.e., change in the same values). For example, when the magnitude of the dipole field for reference magnetic layer_1 215 increases because of a change in temperature, the magnitude of the dipole field for the dipole magnetic layer_1 210 increases in the same amount. This also occurs when the magnitudes decrease because of a change in temperature.

Accordingly, the reference magnetic layer_1 215 and the dipole magnetic layer_1 210 have equal magnitudes and opposite dipole field directions, where their magnitudes have the same temperature dependence. Likewise, the reference magnetic layer_2 220 and the dipole magnetic layer_2 205 have equal magnitudes and opposite dipole field directions, where their magnitudes have the same temperature dependence. This means any temperature dependence of the reference magnetic layer_1 215 and the dipole magnetic layer_1 210 is automatically compensated for. Similarly, any temperature dependence of the reference magnetic layer_2 220 and the dipole magnetic layer_2 205 is automatically compensated for.

The reference magnetic layer_1 215 may have a thickness (in the z-axis) ranging from 1 nm to 10 nm and likewise the dipole magnetic layer_1 210 may have a thickness (in the z-axis) ranging from 1 nm to 10 nm. The reference magnetic layer_2 220 may have a thickness (in the z-axis) ranging from 1 nm to 10 nm, and similarly the dipole magnetic layer_2 205 may have a thickness (in the z-axis) ranging from 1 nm to 10 nm.

Figure 3:
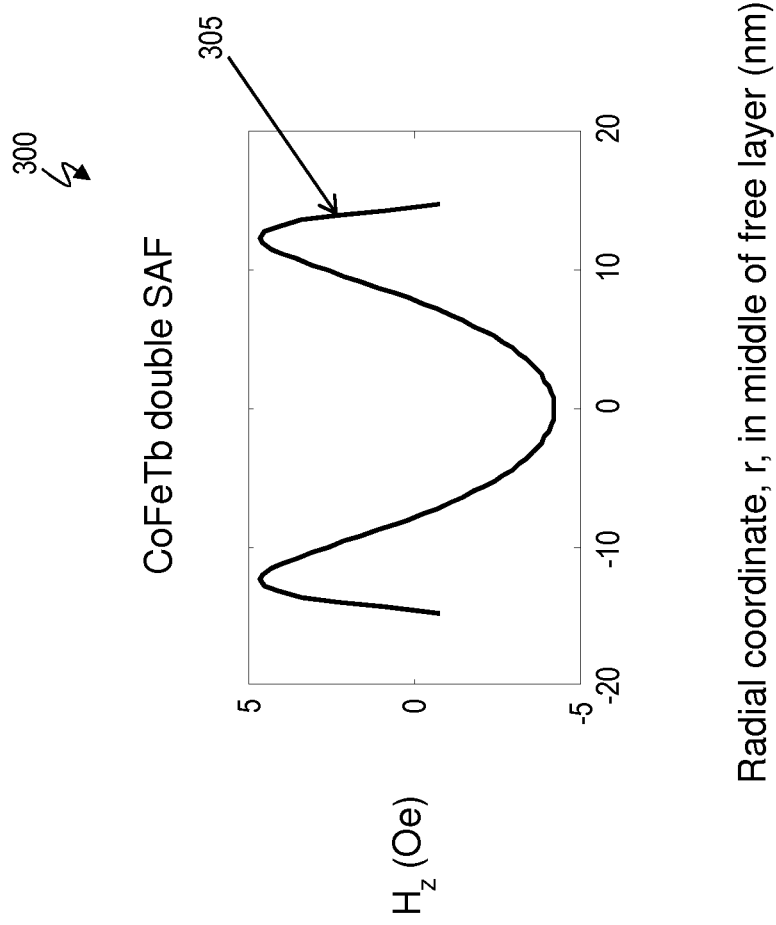
FIG. 3 is a graph illustrating the magnetic dipole field created by the double synthetic antiferromagnet (SAF) in the MRAM device according to an embodiment.

FIG. 3 is a graph 300 illustrating the magnetic dipole field created by the double synthetic antiferromagnet (SAF) (reference magnetic layer_2 220 and reference magnetic layer_1 form the first SAF while dipole magnetic layer_1 210 and dipole magnetic layer_2 205 form the second SAF) and exhibited (felt) on the free magnetic layer 115 in the MRAM device 200 according to an embodiment. The magnetic dipole field for the double SAF is plotted as waveform 305. In FIG. 300, the y-axis shows the magnetic dipole field as Hz (Oe), which means that the magnetic dipole field was measured in the z direction in FIG. 2. Although the magnetic dipole field may flow in more than the z-axis direction (such as x-axis and y-axis), for purposes of the graph 300 (along with graph 400), the graph 300 illustrates how the magnetic dipole field $H_z$ acts upon the free magnetic layer 115 in the z-axis direction.

In the graph 300, the x-axis illustrates the radial coordinate in the middle of the free magnetic layer 115. In this example, assume that the diameter of the MRAM device 200 is about 30 nanometers (nm), and therefore the diameter of the free magnetic layer 115 is about 30 nm. Considered from a cross-sectional view point as shown in FIG. 2, the center of the free magnetic layer 115 is to have the radial coordinate 0. When starting from the center, moving to the right in the x-axis direction traverses from 0 nm to 15 nm, and moving to the left traverses from 0 nm to −15 nm (where −15 nm means traversing the opposite direction along the free magnetic layer 115).

For the calculation in graph 300 in FIG. 3, the tunnel barrier layer 120 is made of MgO and has a thickness of 1 nm, the free magnetic layer 115 is made of CoFeB and has a thickness of 2 nm, the oxide seed layer 110 is made of MgO and as a thickness of 1 nm, the reference magnetic layer_2 220 is made of CoFeTb, has a thickness of 10 nm, and has a saturation magnetization Ms=800 emu/cm$^3$ (where emu is the electromagnetic unit), and the nonmagnetic spacer 225 is made of Ta and has a thickness of 0.2 nm.

Also, for the experiment in graph 300 in FIG. 3, the reference magnetic layer_1 215 is made of CoFe, has a thickness of 1.5 nm, and has a saturation magnetization of Ms=800 emu/cm$^3$, the dipole magnetic layer_1 210 is made of CoFe, has a thickness of 1.5 nm, and has a magnetization of Ms=800 emu/cm$^3$, and dipole magnetic layer_2 205 is made of CoFeTb, has a thickness of 10 nm, and has a magnetization Ms=800 emu/cm$^3$.

As can be seen in graph 300, the double SAF (in MRAM 200) causes two peaks in the magnetic dipole field (as felt by the free magnetic layer 115 near −10 nm and 10 nm), and the two peaks are slightly below 5 Oe (Hz~5 Oe). Also, the double SAF (in MRAM 200) causes a dip in the dipole field at 0 nm (center) of the free magnetic layer 115, and the dip does not reach −5 Oe (Hz~−5 Oe).

The MRAM device 200 (because of the double SAF, i.e., reference magnetic layer 250 and dipole magnetic layer 260) has almost zero local magnetic dipole field (i.e., at each respective radial coordinate) and almost zero average magnetic dipole field on the free magnetic layer 115. The average magnetic dipole field is less than 5 Oe.

Figure 4:
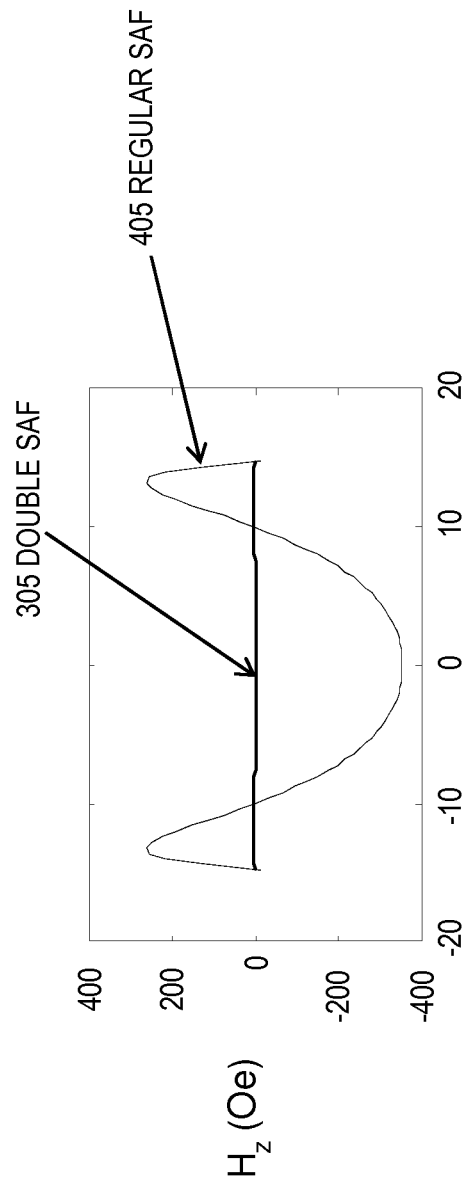
FIG. 4 is a graph illustrating the magnetic dipole fields created by the double synthetic antiferromagnet (SAF) compared to a single SAF according to an embodiment.

FIG. 4 is a graph 400 illustrating a waveform 405 as the magnetic dipole field created by a single SAF in an MRAM device and the waveform 305 as the magnetic dipole field created by double SAF in the MRAM device 200 (discussed in FIG. 3).

In FIG. 4, the single SAF (in a similar MRAM to MRAM 200 but without dipole magnetic layer_1 210 and dipole magnetic layer_2 205) causes two peaks in the dipole field (as felt by the free magnetic layer near −10 nm and 10 nm), and the two peaks are approximately 300 Oe (Hz~300 Oe). Also, the single SAF causes a dip in the dipole field at 0 nm (center) of the free magnetic layer, and the dip is approximately −300 Oe (Hz~−300 Oe).

As compared to the single waveform 405, the double SAF waveform 305 has very little magnetic dipole field effect on the free magnetic layer 115. This small magnetic dipole field disturbs the free magnetic layer 115 less, making free magnetic layer 115 switch more like a single magnetic domain.

Figure 5:
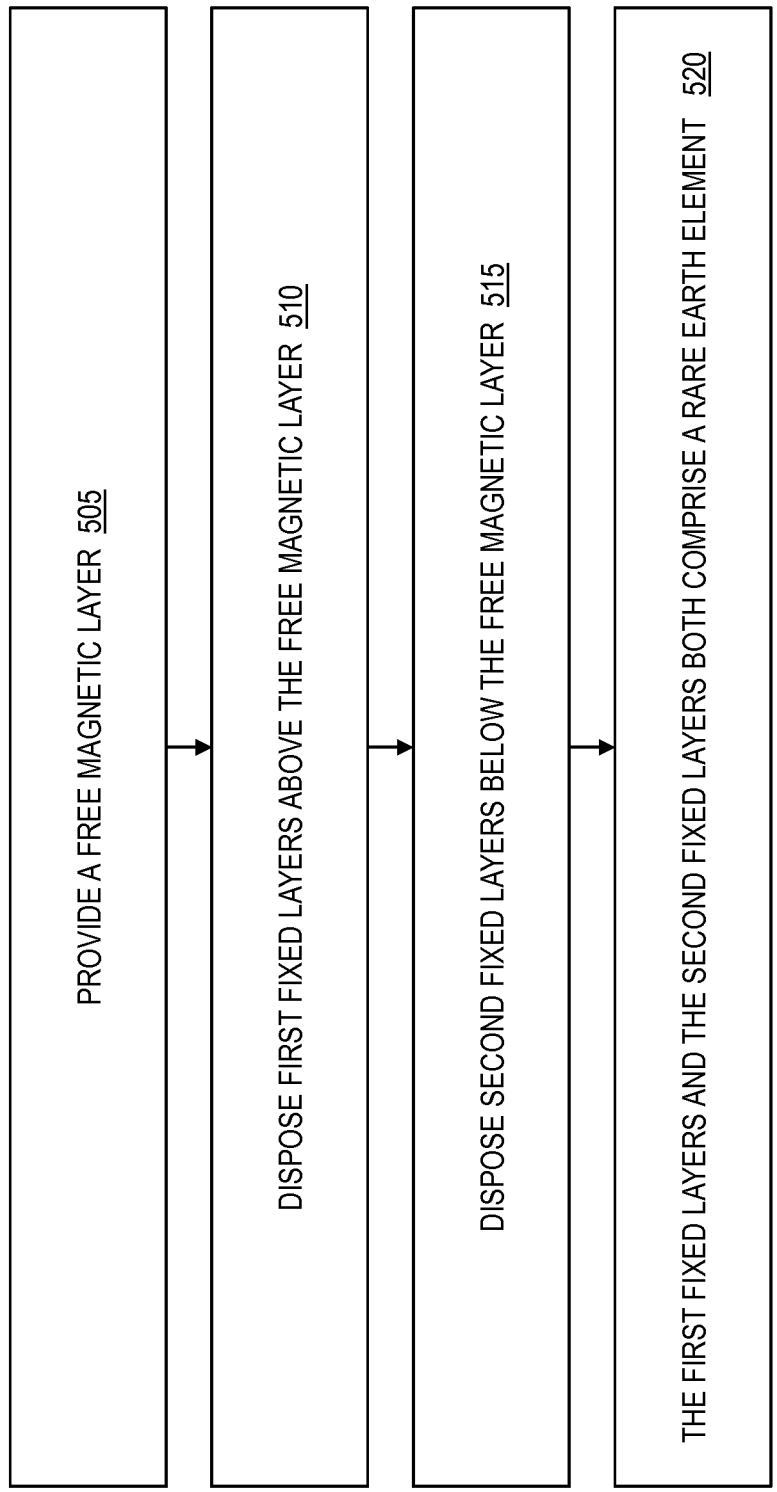
FIG. 5 illustrates a method of forming a magnetic random access memory (MRAM) device according to an embodiment.

Now turning to FIG. 5, a method 500 of forming a magnetic random access memory (MRAM) device 200 is provided according to an embodiment. At block 505, the free magnetic layer 115 is provided. At block 510, first fixed layers (e.g., reference magnetic layer_1 215 and reference magnetic layer_2 220) are disposed above the free magnetic layer 115. At block 515, second fixed layers (e.g., dipole magnetic layer_1 210 and dipole magnetic layer_2 205) are disposed below the free magnetic layer 115. At block 520, the first fixed layers (e.g., reference magnetic layer_1 215 and reference magnetic layer_2 220) and the second fixed layers (e.g., dipole magnetic layer_1 210 and dipole magnetic layer_2 205) both comprise a rare earth element (e.g., one or more rare earth elements).

The first fixed layers (e.g., reference magnetic layer_1 215 and reference magnetic layer_2 220) and the second fixed layers (e.g., dipole magnetic layer_1 210 and dipole magnetic layer_2 205) both comprise a transition metal in addition to the rare earth element. The transition metal includes at least one of Co, Fe, and Ni. The rare earth element includes at least one of Tb, Gd, and/or europium (Eu).

The first fixed layers (e.g., reference magnetic layer_1 215 and reference magnetic layer_2 220) and the second fixed layers (e.g., dipole magnetic layer_1 210 and dipole magnetic layer_2 205) comprise at least one of CoFe and Tb multilayers and a CoFeTb alloy.

The first fixed layers and the second fixed layers comprise at least one of CoFe and Gd multilayers and a CoFeGd alloy. The free magnetic layer 115 is sandwiched between two oxide layers (e.g., the tunnel barrier layer 120 and oxide seed layer 110). The free magnetic layer 115 is grown on the oxide seed layer 110. One side of the free magnetic layer 115 is adjacent to the oxide seed layer 110, and the another side of the free magnetic layer 115 is adjacent to the tunnel barrier layer 120. The first fixed layers (e.g., reference magnetic layer_1 215 and reference magnetic layer_2 220) or the second fixed layers (e.g., dipole magnetic layer_1 210 and dipole magnetic layer_2 205) are adjacent to the tunnel barrier layer 120. There may be a case when the layers above and below the free magnetic layer 115 are reversed.

At least one of the first fixed layers (e.g., reference magnetic layer_1 215 and reference magnetic layer_2 220) and the second fixed layers (e.g., dipole magnetic layer_1 210 and dipole magnetic layer_2 205) comprises a nonmagnetic spacer layer 225. Although the dipole magnetic layer_1 210 and dipole magnetic layer_2 205 are not shown sandwiching the nonmagnetic spacer layer 225, the nonmagnetic spacer layer 225 may be included in the dipole magnetic layer 260.

Figure 6:
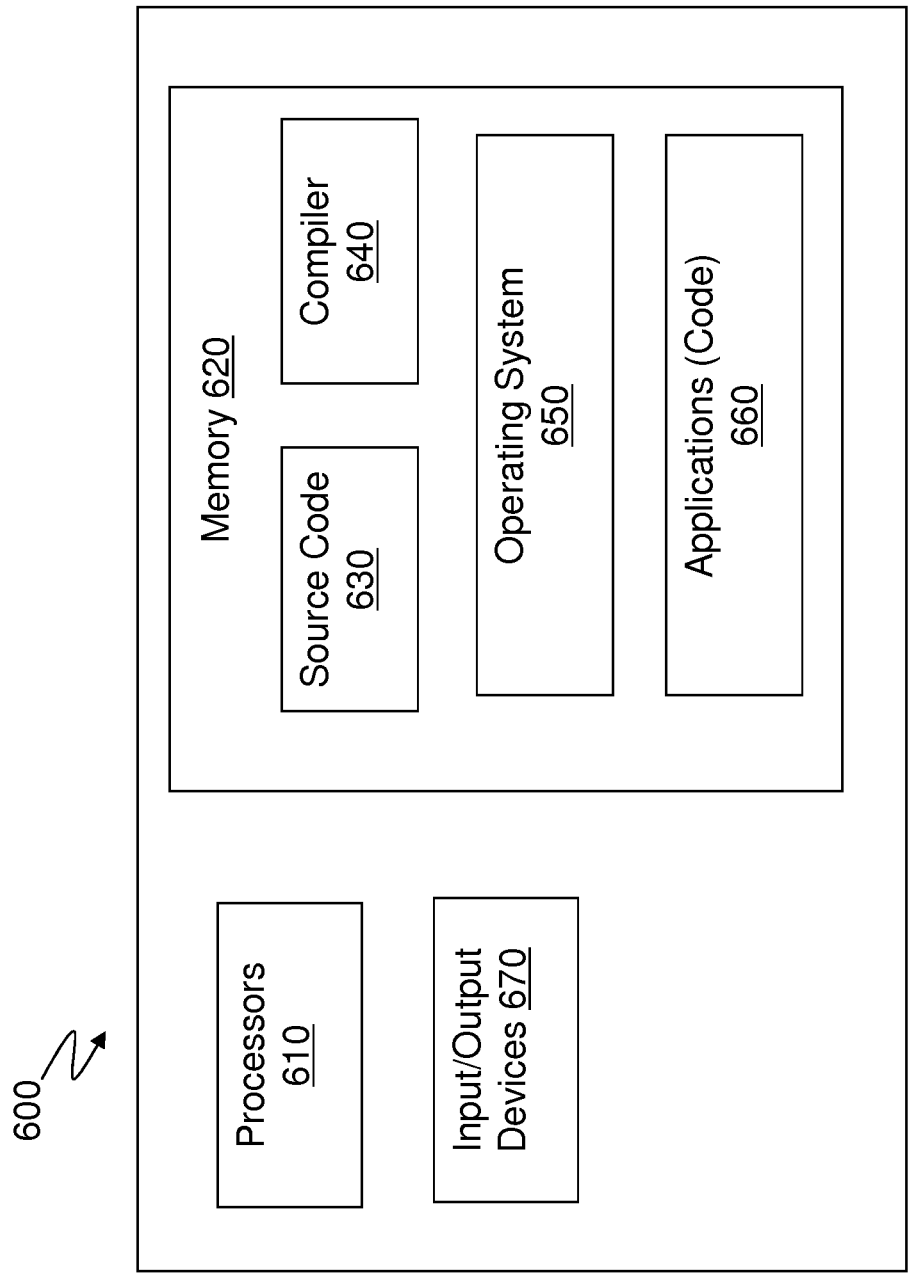
FIG. 6 illustrates an example computer that can implement and include features discussed herein according to an embodiment.

FIG. 6 illustrates an example computer 600 that can implement features discussed herein. The computer 600 may include a plurality of spin torque MRAM devices 200 connected in a grid to form addressable memory cells. One skilled in the art understands how to connect spin torque MRAM devices. The computer 600 may be a distributed computer system over more than one computer. Various methods, procedures, modules, flow diagrams, tools, applications, circuits, elements, and techniques discussed herein may also incorporate and/or utilize the capabilities of the computer 600. Indeed, capabilities of the computer 600 may be utilized to implement and execute features of exemplary embodiments discussed herein.

Generally, in terms of hardware architecture, the computer 600 may include one or more processors 610, computer readable storage memory 620 (which may include one or more MRAM devices 200, e.g., in an array), and one or more input and/or output (I/O) devices 670 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620.

The computer readable memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Note that the memory 620 can have a distributed architecture, where various components are situated remote from one another, but can be accessed by the processor(s) 610.

The software in the computer readable memory 620 may include one or more separate programs, each of which comprises an ordered listing of executable instructions for implementing logical functions. The software in the memory 620 includes a suitable operating system (O/S) 650, compiler 640, source code 630, and one or more applications 660 of the exemplary embodiments.

The I/O devices 670 may include input devices (or peripherals) such as, for example but not limited to, a mouse, keyboard, scanner, microphone, camera, etc. Furthermore, the I/O devices 650 may also include output devices (or peripherals), for example but not limited to, a printer, display, etc. Finally, the I/O devices 670 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 670 also include components for communicating over various networks, such as the Internet or an intranet. The I/O devices 670 may be connected to and/or communicate with the processor 610 utilizing Bluetooth connections and cables (via, e.g., Universal Serial Bus (USB) ports, serial ports, parallel ports, FireWire, HDMI (High-Definition Multimedia Interface), etc.).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), astatic random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A magnetic random access memory (MRAM) device, comprising:
    a free magnetic layer;
    first fixed layers disposed above the free magnetic layer; and
    second fixed layers disposed below the free magnetic layer;
wherein the first fixed layers and the second fixed layers both comprise a rare earth element;
    wherein the first fixed layers comprise a first reference magnetic layer having a magnetic moment in a first direction and a second reference magnetic layer having a magnetic moment in a second direction, the second direction being opposite the first direction;
    wherein a nonmagnetic spacer layer is sandwiched between the first reference magnetic layer and the second reference magnetic layer,
    wherein the second fixed layers comprise a first dipole magnetic layer having a magnetic moment in the second direction and a second dipole magnetic layer having a magnetic moment in the first direction, and wherein the first dipole magnetic layer is adjacent to the second dipole magnetic layer.

2. The device of claim 1, wherein the first fixed layers and the second fixed layers both comprise a transition metal in addition to the rare earth element.

3. The device of claim 2, wherein the transition metal includes at least one of Co, Fe, and Ni.

4. The device of claim 1, wherein the rare earth element is a selection from the group consisting of cerium, praseodymium, neodymium, promethium, samarium, europium, dysprosium, holmium, erbium, thulium, ytterbium, and lutetium.

5. The device of claim 1, wherein the first fixed layers and the second fixed layers comprise at least one of CoFe and Tb multilayers and a CoFeTb alloy.

6. The device of claim 1, wherein the first fixed layers and the second fixed layers comprise at least one of CoFe and Gd multilayers and a CoFeGd alloy.

7. The device of claim 1, wherein the free magnetic layer is sandwiched between two oxide layers.

8. The device of claim 1, wherein the free magnetic layer is grown on an oxide seed layer;
    wherein one side of the free magnetic layer is adjacent to the oxide seed layer;
    wherein another side of the free magnetic layer is adjacent to a tunnel barrier layer; and
    wherein the first fixed layers or the second fixed layers are adjacent to the tunnel barrier layer.

9. The device of claim 1, wherein at least one of the first fixed layers and the second fixed layers comprises a nonmagnetic spacer layer.

10. A method of forming a magnetic random access memory (MRAM) device, the method comprising:
    providing a free magnetic layer;
    disposing first fixed layers above the free magnetic layer; and
    disposing second fixed layers below the free magnetic layer;
    wherein the first fixed layers and the second fixed layers both comprise a rare earth element, and
    wherein the first fixed layers comprise a first reference magnetic layer having a magnetic moment in a first direction and a second reference magnetic layer having a magnetic moment in a second direction, the second direction being opposite the first direction;
    wherein a nonmagnetic spacer layer is sandwiched between the first reference magnetic layer and the second reference magnetic layer,
    wherein the second fixed layers comprise a first dipole magnetic layer having a magnetic moment in the second direction and a second dipole magnetic layer having a magnetic moment in the first direction, and wherein the first dipole magnetic layer is adjacent to the second dipole magnetic layer.

11. The method of claim 10, wherein the first fixed layers and the second fixed layers both comprise a transition metal in addition to the rare earth element.

12. The method of claim 11, wherein the transition metal includes at least one of Co, Fe, and Ni.

13. The method of claim 10, wherein the rare earth element includes Eu.

14. The method of claim 10, wherein the first fixed layers and the second fixed layers comprise at least one of CoFe and Tb multilayers and a CoFeTb alloy.

15. The method of claim 10, wherein the first fixed layers and the second fixed layers comprise at least one of CoFe and Gd multilayers and a CoFeGd alloy.

16. The method of claim 10, wherein the free magnetic layer is sandwiched between two oxide layers.

17. The method of claim 10, wherein the free magnetic layer is grown on an oxide seed layer;
- wherein one side of the free magnetic layer is adjacent to the oxide seed layer;
- wherein another side of the free magnetic layer is adjacent to a tunnel barrier layer; and
- wherein the first fixed layers or the second fixed layers are adjacent to the tunnel barrier layer.

18. The method of claim 10, wherein at least one of the first fixed layers and the second fixed layers comprises a nonmagnetic spacer layer.

\* \* \* \* \*